(12) United States Patent
Mclellan et al.

(10) Patent No.: US 6,229,200 B1
(45) Date of Patent: May 8, 2001

(54) SAW-SINGULATED LEADLESS PLASTIC CHIP CARRIER

(75) Inventors: Neil Mclellan, Hong Kong; Nelson Fan, Sham Tseng, both of (HK)

(73) Assignee: ASAT Limited, Tsuen Wan NT (HK)

( * ) Notice: Subject to any disclaimer, the term of this patent is extended or adjusted under 35 U.S.C. 154(b) by 0 days.

(21) Appl. No.: 09/095,803

(22) Filed: Jun. 10, 1998

(51) Int. Cl.[7] .................................................. H01L 23/495
(52) U.S. Cl. ........................ 257/666; 257/684; 257/730; 257/670; 257/676; 257/712
(58) Field of Search ................... 257/666, 730, 257/684, 670, 675, 676, 707, 712, 787

(56) References Cited

U.S. PATENT DOCUMENTS

| | | | |
|---|---|---|---|
| 4,812,896 | 3/1989 | Rothgery et al. .................. 357/70 |
| 5,157,480 | * 10/1992 | McShane et al. ................... 361/404 |
| 5,200,362 | * 4/1993 | Lin et al. ............................ 437/207 |
| 5,200,809 | 4/1993 | Kwon .................................. 257/707 |
| 5,214,845 | 6/1993 | King et al. .......................... 29/841 |
| 5,216,278 | 6/1993 | Lin et al. ............................ 257/688 |
| 5,221,642 | 6/1993 | Burns .................................. 437/207 |
| 5,273,938 | * 12/1993 | Lin et al. ............................ 437/207 |
| 5,277,972 | 1/1994 | Sakumoto et al. ................. 428/355 |
| 5,279,029 | 1/1994 | Burns .................................. 29/856 |
| 5,332,864 | 7/1994 | Liang et al. ........................ 174/52.4 |
| 5,343,076 | 8/1994 | Katayama et al. ................ 257/717 |
| 5,406,124 | 4/1995 | Morita et al. ...................... 257/783 |
| 5,424,576 | 6/1995 | Djennas et al. .................... 257/666 |
| 5,474,958 | 12/1995 | Djennas et al. .................... 437/211 |
| 5,604,376 | 2/1997 | Hamburgen et al. .............. 257/676 |
| 5,608,267 | 3/1997 | Mahulikar et al. ................ 257/796 |
| 5,639,990 | 6/1997 | Nishihara et al. ................. 174/52.2 |
| 5,640,047 | 6/1997 | Nakashima ........................ 257/738 |
| 5,641,997 | 6/1997 | Ohta et al. ......................... 257/788 |
| 5,646,831 | 7/1997 | Manteghi ........................... 361/813 |
| 5,650,663 | 7/1997 | Parthasarathi .................... 257/706 |
| 5,683,806 | 11/1997 | Sakumoto et al. ................ 428/343 |
| 5,696,666 | 12/1997 | Miles et al. ........................ 361/764 |
| 5,701,034 | 12/1997 | Marrs ................................ 257/706 |
| 5,710,064 | 1/1998 | Song et al. ......................... 437/220 |
| 5,894,108 | * 4/1999 | Mostafazadeh et al. .......... 174/52.4 |
| 6,001,671 | * 12/1999 | Fjelstad ............................. 438/112 |

* cited by examiner

Primary Examiner—Minh Loan Tran
(74) Attorney, Agent, or Firm—Skjerven Morrill MacPherson LLP; Edward C. Kwok

(57) ABSTRACT

Leadless plastic chip carriers are formed from a matrix of lead frames provided in a section of a metal strip. Each lead frame in the matrix includes a die-attach pad and multiple leads disposed in close proximity to the die-attach pad. After a semiconductor die is attached to each of the die-attach pad and wire-bonded, the leadless plastic chip carriers are formed by providing a plastic encapsulation which exposes the bottom sides of the die-attach pad and the leads. The bottom sides of the leads serve as solder pads to be used for attaching the leadless plastic chip carrier to a printed circuit board.

9 Claims, 6 Drawing Sheets

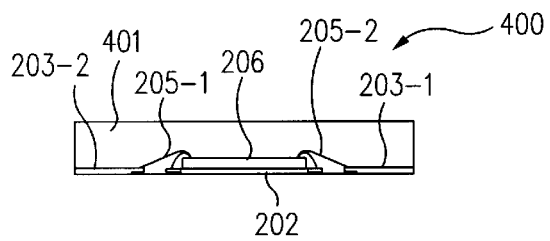
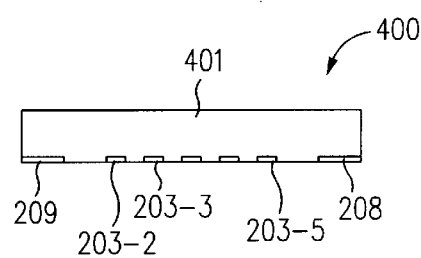
FIG. 4a  FIG. 4b
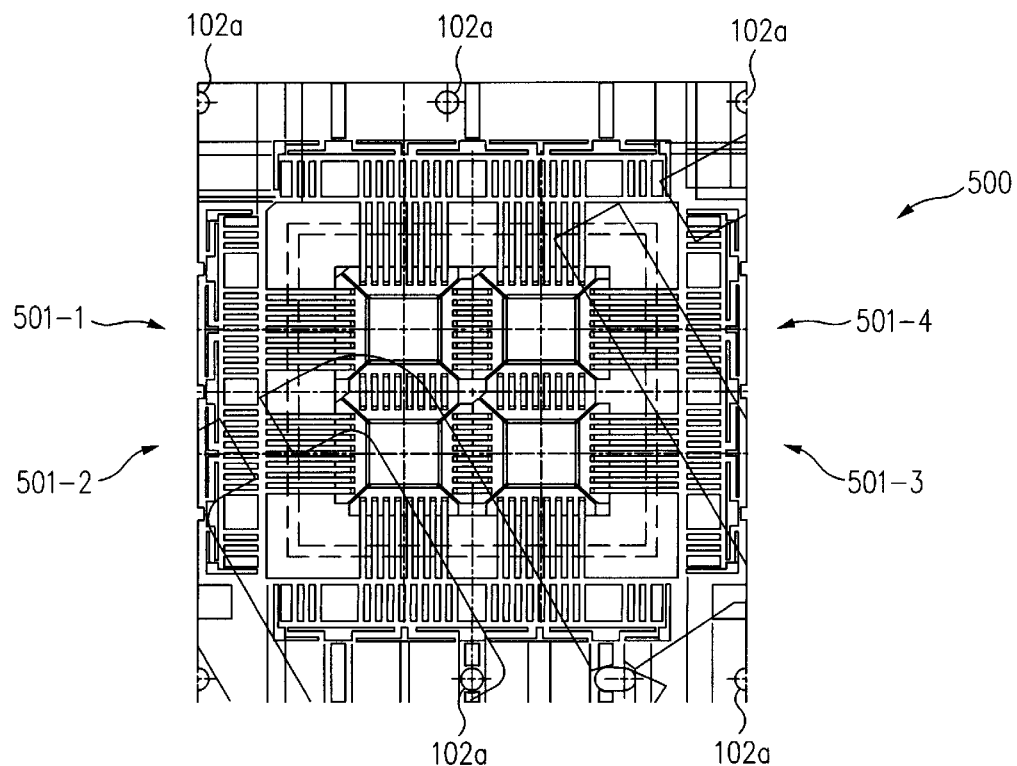
FIG. 5a

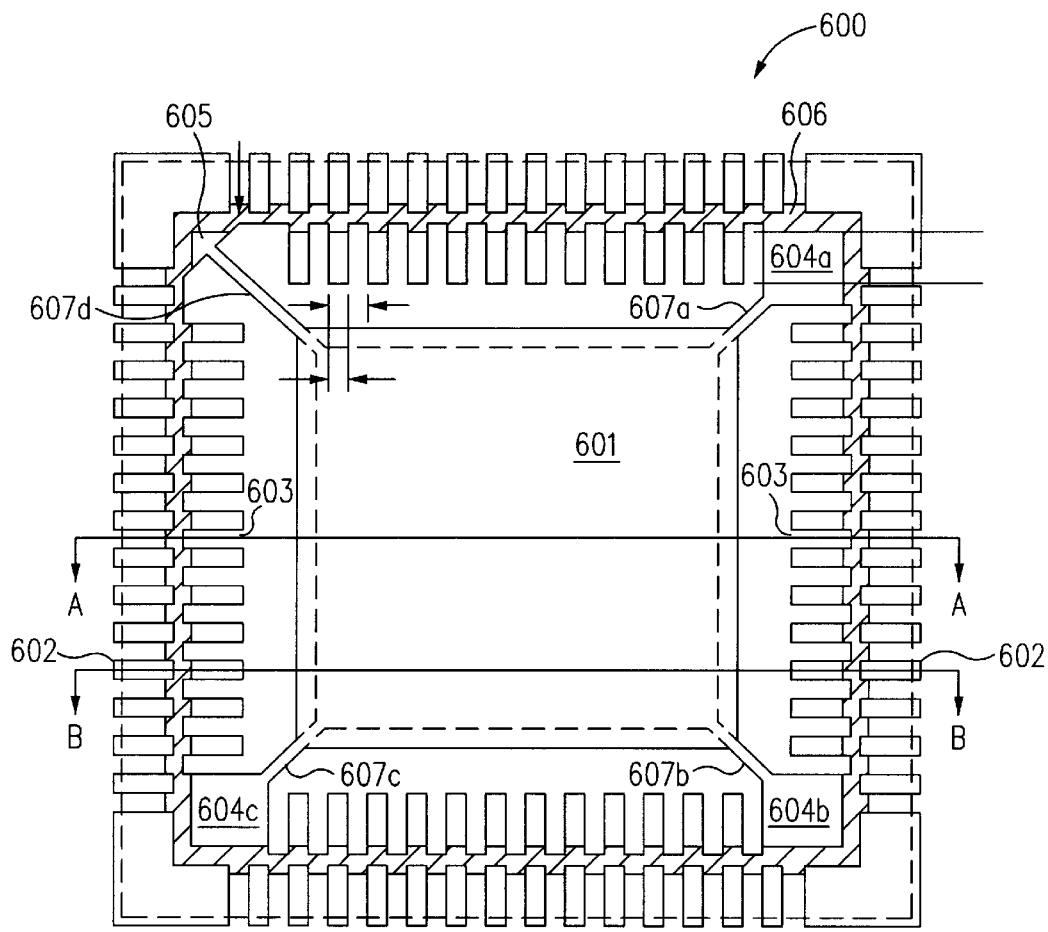
FIG. 6a
FIG. 6b (A-A)
FIG. 6c (B-B)

SAW-SINGULATED LEADLESS PLASTIC CHIP CARRIER

BACKGROUND OF THE INVENTION

1. Field of the Invention

The present invention relates to integrated circuit package technology. In particular, the present invention relates to resin-encapsulated integrated circuit packages.

2. Discussion of the Related Art

Conventional lead frames are typically formed on a metal strip which provides up to ten (10) units. A conventional lead frame includes a "die pad" for accommodating a semiconductor die, and inner leads and outer leads. A lead frame can be incorporated in a variety of integrated circuit packages, such as a quad flat pack (QFP) package and its many variations. In a QFP package, each bond pad provided on the semiconductor die is wire-bonded to an inner lead which, in turn, is electrically coupled to an outer lead. The inner leads are typically provided mold-locking features to allow proper positioning of the lead frame during the molding step which provides a plastic or resin encapsulation of the package. After encapsulation, the outer leads are trimmed and bent using custom trim and form tools to complete the electrical terminals or "leads" used for mounting the package on to a printed circuit board. Precise forming of the leads is necessary to ensure satisfactory board yield. Malformed leads can result in open or shorted solder joints because of aplanarity or skewed leads. In addition, even without such malformed leads, board yield in QFP packages is also diminished by open solder joints resulting from solder wicking up the leads.

The size of a prior art QFP package is limited by the dimensions of the semiconductor die plus about 3 mm on each side. For example, a 7 mm×7 mm QFP package can accommodate up to a 4 mm×4 mm semiconductor die. Clearance requirements on a printed circuit board can add another 2 mm on each side to the final foot print. Thus, a 7 mm×7 mm QFP typically has a footprint of 9 mm×9 mm, thereby providing an effective board density of approximately 20%.

Conventional QFP type packages are encapsulated in resin both at the top and the bottom of the semiconductor die. Consequently, conventional QFP packages cannot be made thinner than 1.4 mm. In addition, external lead "stand-off" requirements add to the height of the final printed circuit board assembly.

One important quality measure for an integrated circuit package is reliability. In a QFP package, a significant failure mode is the delamination of the mold compound from the back of a die pad. Delamination introduces moisture into the package and causes moisture-related failures.

One performance measure in a conventional QFP or any plastic package is thermal performance. Such a package is limited in its thermal performance because of a lack of a thermally conductive path to dissipate heat from the semiconductor die to the exterior. In many applications, a heat sink is included in the package. However, including a heat sink increases the material cost of such a package. Further, even if a heat sink is included, there are still typically multiple layers of epoxy through which heat must flow from the semiconductor die to the exterior.

A conventional QFP package is typically manufactured in an assembly process which requires a custom mold, a custom trim tool and a custom form tool. Thus, the tooling cost for manufacturing a new QFP package is high. For a given integrated circuit, rather than providing a package that is optimized specifically for its size and its number of input/output (I/O) terminals, a designer typically selects a package by matching the size and I/O terminals requirements of his integrated circuit as closely as possible to one of a few available QFP packages for which the tooling investment is already made. Clearly, the resulting QFP package is optimized for neither density nor material cost.

What is desired is a low cost, high density, high reliability integrated circuit package with flexible configuration.

SUMMARY OF THE INVENTION

The present invention provides a plastic chip carrier and a method for making the same. A plastic chip carrier of the present invention includes: (a) a semiconductor die with bonding pads formed on its surface; (b) a die-attach pad on which the semiconductor die is attached; (c) leads disposed in close proximity of the die-attach pad; (d) wires bonded to the bonding pads and their corresponding leads to provide electrical connections; and (e) an encapsulation sealing the semiconductor die, the die attach-pad, the wires, and the leads from the environment in such a manner as to expose only the bottom surfaces of the die-attach pad and the leads.

The plastic chip carrier is formed using a process which includes the operations: (a) forming a matrix of lead frames out of a metal strip, with each lead frame having a die-attach pad and leads disposed in close proximity of the die-attach pad; (b) attaching a semiconductor die to each of the die-attach pad of the lead frame; (c) wire-bond the semiconductor die to the leads, so as to allow the leads to serve as electrical terminals to the semiconductor die; and (d) encapsulating the die-attach pad, the semiconductor die, the bond wires and the leads in a resin material to form a package, in such a manner that only the bottom surface of the die-attach pad and the bottom surfaces of the leads are exposed.

In one embodiment, the plastic chip carrier has an interlocking lip around the periphery of the die-attach pad, so as to allow the encapsulation material to securely engage the die-attach pad. In another embodiment, tie bars are provided attached to the die-attach pad. Each tie bar extends from the die-attach pad outwards to form a peripheral heat pad at the other end. Heat from the operating semiconductor die is conducted by the tie bar to the heat pad for dissipation out of the encapsulation. One of the heat pads has an appearance distinctive from the other heat pads of the chip carrier, thereby providing a convenient marker on the chip carrier which can be used to identify an orientation of the chip carrier or the location of a specified pin, such as pin 1.

In one embodiment, the die-attach pad of the plastic chip carrier is pre-plated with palladium to avoid silver migration. In addition, the top surface of the encapsulation is provided a distinctive pattern, which can be conferred to the encapsulation from the molding cavity during the molding process. This pattern, which can be a dimple array, for example, can be used to orient the package after singulation. Alternatively, solder balls can be attached to the exposed portions of the leads to provide some clearance between the printed circuit board on which the package is mounted and the plastic chip carrier. In one embodiment, a soft solder attaches the semiconductor die to the die-attach pad to provide improved thermal performance.

According to another aspect of the present invention, a plastic carrier includes a double-row lead frame having leads arranged as an annular row of inner leads and an annular row of outer leads. The lead frame includes (a) a die-attach pad;

(b) an annular row of inner leads; (c) an annular row of outer leads connected to the annular row of inner leads by a connecting portion. The connecting portion has a thickness which is half the thickness of a lead in the annular rows of inner and outer leads. In one implementation, the leads in the annular row of inner leads and the annular row of outer leads are arranged in an alternating fashion, to allow maximum density for wire bonds from the bonding pads of the semiconductor die at the die-attach pad to the inner and outer leads.

The double-row frame can be formed in a matrix of substantially identical lead frames. Further, the matrix of lead frames can be formed as one of multiple matrices of lead frames formed in a metal strip.

The present invention is better understood upon consideration of detailed description below and the accompanying drawings.

BRIEF DESCRIPTION OF THE DRAWINGS

FIG. 4a shows a molded package 400 in a cross section along one dimension of the die-attach pad.

FIG. 4b shows a side view of molded package 400.

FIG. 5a shows a 2×2 array 500 of lead frames, including lead frames 501-1 to 501-4, which can be implemented in a section of strip 100, in accordance with another embodiment of the present invention.

FIG. 5b shows in further detail lead frame 501, which is one of lead frames 501-1 to 501-4 of FIG. 5a.

FIG. 6a shows a lead frame 600 for a "doublerow" SSLPCC, in accordance with another embodiment of the present invention.

FIG. 6b shows a cross-section of lead frame 600 of FIG. 6a, along line A—A of FIG. 6a.

FIG. 6c shows a cross-section of lead frame 600 of FIG. 6a, along line B—B of FIG. 6a.

FIG. 8a shows a cross-section of a double-row SSLPCC, including lead frame 600 of FIG. 6a, along line A—A of FIG. 6a.

FIG. 8b shows a cross-section of a double-row SSLPCC, including lead frame 600 of FIG. 6a, along line B—B of FIG. 6a

DETAILED DESCRIPTION OF THE PREFERRED EMBODIMENTS

Figure 1:
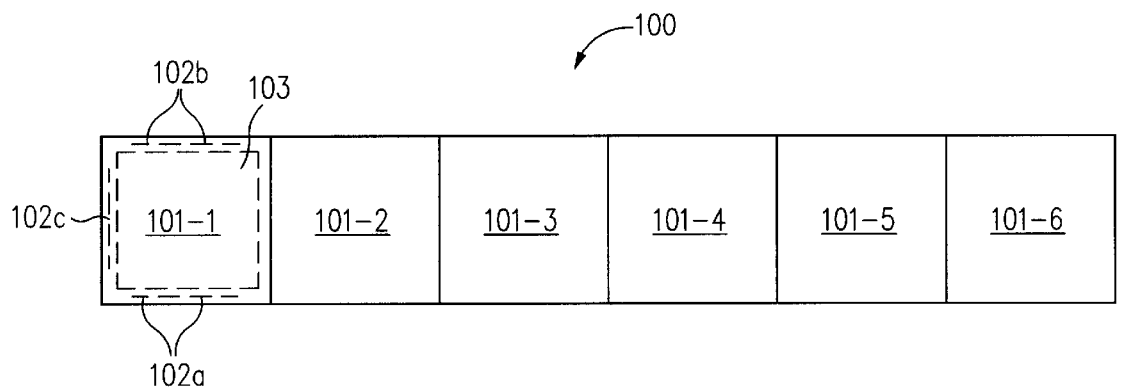
FIG. 1 shows a strip 100, including six substantially identical sections 101-1 to 101-6, which can be used to fabricate packages of the present invention.

The present invention provides a saw-singulated leadless plastic chip carrier (SSLPCC) and a method for assembling such a chip carrier. The SSLPCC of the present invention is a low-cost, high density, high reliability integrated circuit package with superb thermal and electrical performances. To facilitate cross-reference between figures, in the figures described below, like elements are provided like reference numerals.

Figure 2A:
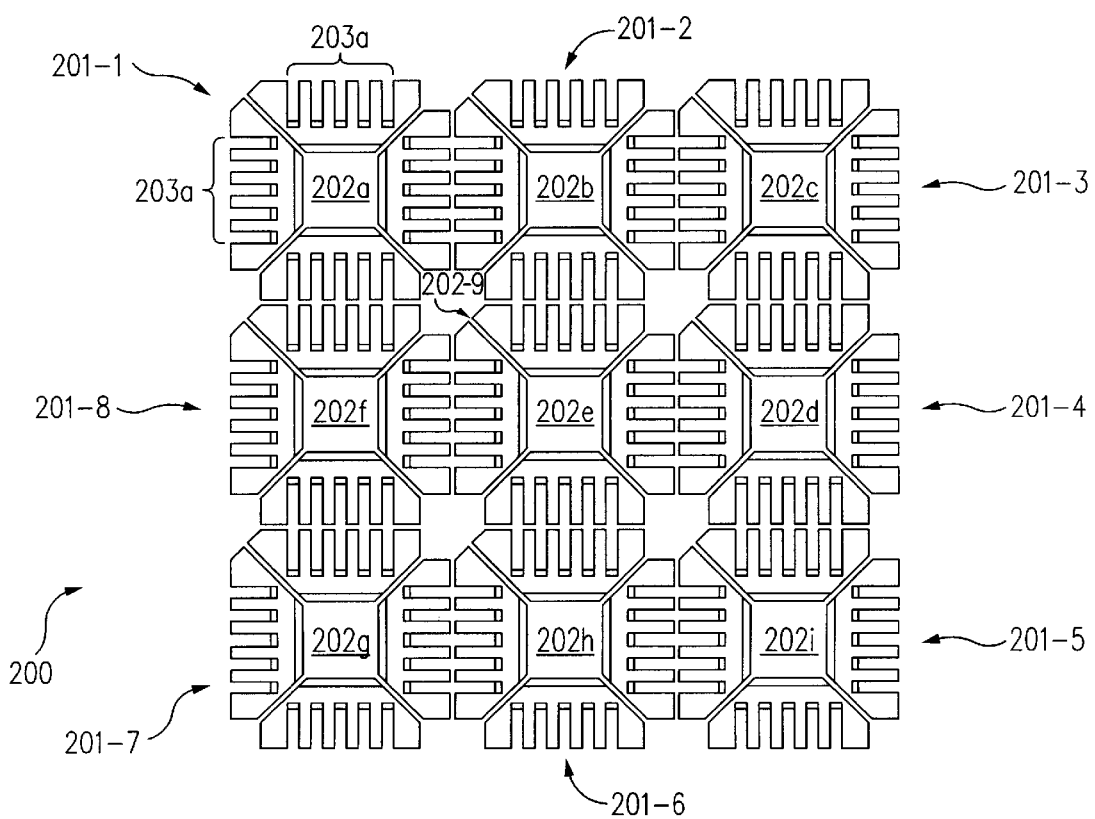
FIG. 2a shows a 3×3 array of lead frames which can be provided in any of the sections of strip 100.

FIG. 1 shows a strip 100 including six substantially identical sections 101-1 to 101-6, which can be used to fabricate the packages of the present invention. Using such a strip allows the assembly process to be carried out in conventional automated assembly equipment and molds. Within each of sections 101-1 to 101-6 is an area 103 in which lead frames of the present invention can be formed using a conventional process, such as a chemical etching process or a stamping process. A 3×3 array of lead frames, labeled 200 in FIG. 2a, can be formed in area 103, as shown in FIG. 2a. On the periphery of area 103 are placed alignment targets and tooling throug-holes and other conventional features (labeled, collectively, by reference numerals 102a) used in automated assembly equipment.

Figure 2B:
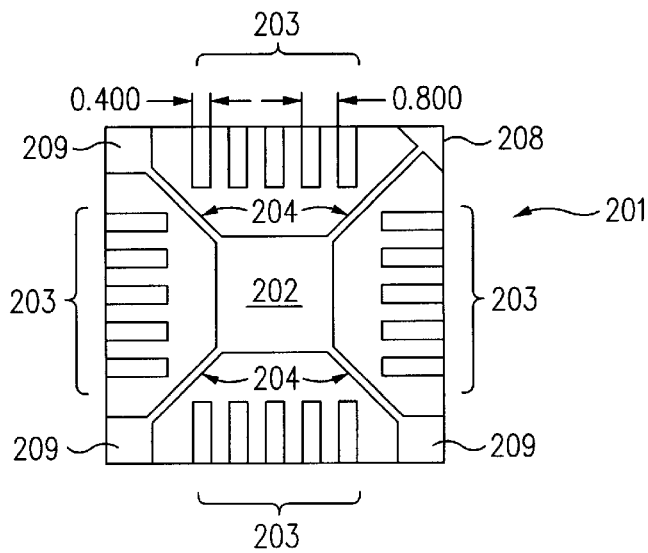
FIG. 2b shows lead frame 201 including die-attach pad 202 suspended by tie bars 204, which are integrally formed with leads 203.

FIG. 2a shows 3×3 array 200 of lead frames, including lead frames 201-1 to 201-9, which can be formed in a section of strip 100. Thus, in this configuration, 54 lead frames can be formed strip 100. Each lead frame, e.g., lead frame 201-1, includes a die-attach pad (e.g., die-attach pad 202a of lead frame 201-1) and a group of leads (e.g., leads 203a of lead frame 201-1) provided in close proximity to the die-attach pad. An exemplary lead frame 201 is shown in further detail in FIG. 2b. As shown in FIG. 2b, lead frame 201 includes die-attach pad 202 suspended by tie bars 204, which are integrally formed with leads 203. In lead frame 201, tie bars 204 each extend towards the periphery of lead frame 201 to form a heat pad (e.g., any one of heat pads 208 and 209) at one corner of the molded package to be formed. Such a heat pad provides a highly thermally conductive path for transferring heat from die-attach pad 202 out of the molded package to be formed. One such heat pad, labeled 208 in FIG. 2b is made slightly different from the other heat pads (each labeled 209) formed in the other tie bars. In this embodiment, die-attach pad 202 is 5 mm on a side, and each of leads 203 is 0.4 mm wide and 0.13 mm thick. Spacing between adjacent leads is also 0.4 mm. Lead frame 201 can be pre-plated with palladium to avoid silver migration.

Figure 3:
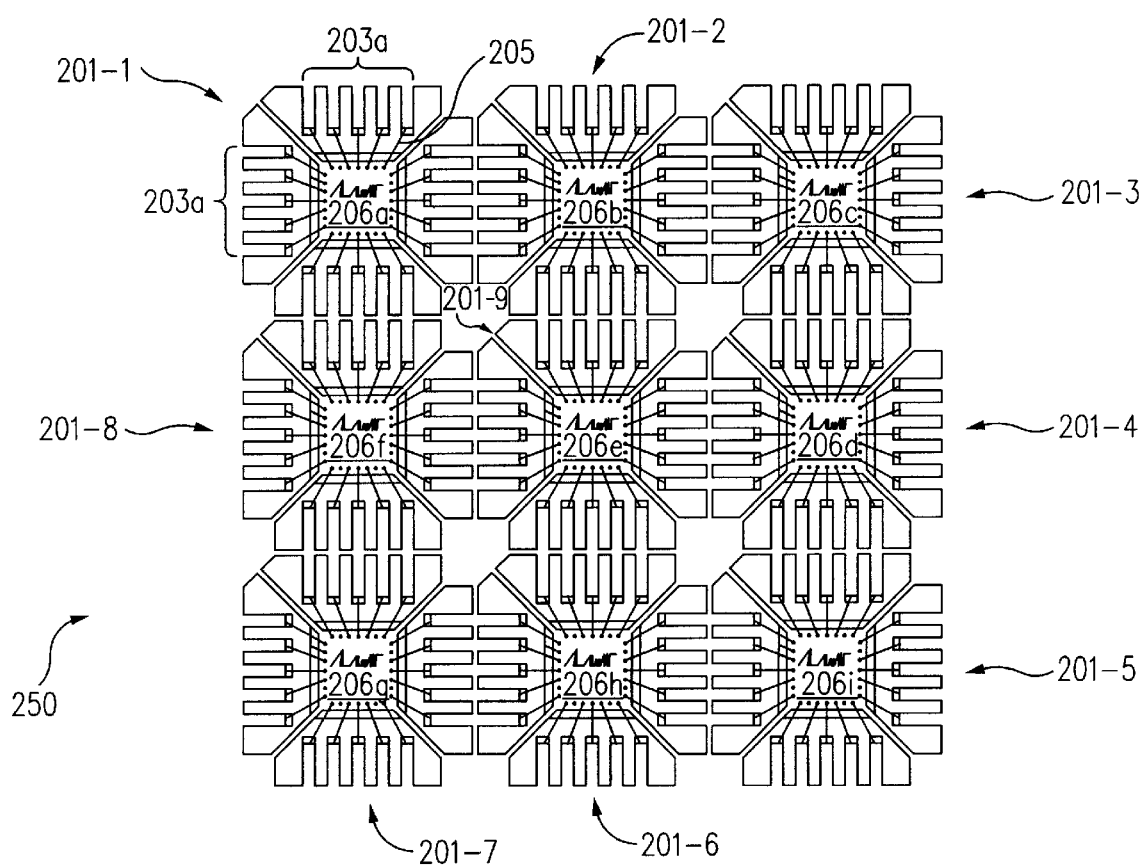
FIG. 3 shows FIG. 2a's 3×3 array 200 of lead frames, after attachment of semiconductor dies to its die attach pads and wire-bonding.

During the assembly process, a singulated semiconductor die is conventionally mounted or attached by epoxy or any suitable adhesive to each of die-attach pads (e.g., die attach pads 202a–202i). The semiconductor die can also be attached using a soft solder to provide thermal conductivity between the semiconductor die and the die-attach pad, thereby improving the thermal performance of the resulting package. After the adhesive is cured, if required, each semiconductor die is wire-bonded to the leads (e.g., leads 203a) located at the periphery of the die-attach pad, using conventional automated bonding equipment. Gold wires can be used in this wire-bonding operation. FIG. 3 shows 3×3 array 200 of FIG. 2b, after die-attachment (note, for example, semiconductor die 206a) and wire-bonding. Wire-bonds 205 electrically couple each bonding pad on semiconductor die 206a to a corresponding one of leads 203a.

Following wire-bonding, strip 100 is conventionally molded using a mold in which the bottom plate is a flat plate, so that the molding compound exposes the bottom surfaces of the die-attach pads, the heat pads of the tie bars, and the leads. The under side of strip 100 is then deflashed to remove any molding compound residues from the exposed surfaces of the lead frames, so as to allow the leads and the die-attach pad to serve as solder pads for attachment to the printed circuit board at a subsequent time. As mentioned above, one of the heat pads formed on the tie bars is provided a difference appearance from the other heat pads. This different appearance can serve as a built-in marker to indicate a designated pin (e.g., pin 1) of the package, or to help identify an orientation of the package. optionally, strip 100 can then be ink-marked and solder-plated to facilitate a subsequent board-attach step. Solder plating is not necessary if strip 100 was pre-plated with palladium. Solder balls can also be attached to the exposed portions of the leads to provide a clearance when mounted on a printed circuit board. Such clearance facilitates cleaning (e.g., cleaning of solder flux).

Finally, strip 100 is mounted to a wafer saw ring by an adhesive tape and saw-singulated using a conventional wafer saw. Singulation can be guided by a pattern formed on the top side of the package during molding. Such a pattern, e.g., a dimple array, which can be easily transferred from the molding cavity of a mold, is also useful for automated orienting or positioning of the resulting singulated package. The singulated component is then ready for mounting onto a printed circuit board. Since no trimming or forming of leads are necessary, in addition to eliminating the costs associated with such steps, the packages manufactured under the present method described above do not suffer yield loss from defective trimming and forming of the external leads.

FIG. 4a shows a molded package 400 in a cross section along one dimension of the die-attach pad. As shown in FIG. 4, semiconductor die 206 is attached to die-attach pad 202 as described above. Conductive wires 205-1 and 205-2 are bonded to bonding pads on semiconductor die 206 and their respective leads 203-1 and 203-2. Molded package 400 is encapsulated in encapsulation material 401. In this embodiment, molded package 400 measures only 1.2 mm thick. A side view of molded package 400 is provided in FIG. 4b. FIG. 4b shows heat pads 208 and 209 at the corners of molded package 400. Since die-attach pad 202, leads 203 and heat pads 208 and 209 are all exposed, the thermal performance of molded package 400 is expected to be much higher than conventional QFP packages. Since die-attach pad 202 is exposed, the delamination problem of a conventional QFP package is avoided. Further, high reliability can be further enhanced in molded package 400 if the coefficient of expansion of molding material 401 is matched to the coefficient of expansion of the printed circuit board to which molded package 400 is to be mounted.

Unlike QFP packages of the prior art, because no additional clearance between packages is needed to accommodate the outer leads, a much smaller footprint is achievable in molded package 400. For example, in this embodiment, molded package 400 can accommodate up to a 5 mm×5 mm semiconductor die on a 7 mm×7 mm footprint, thus providing a effective bond density of 25/49 or almost 50%. Further, since only the top sides of the die-attach pad and the leads are molded, and since the exposed portions of the leads serve as solder pads, thus obviating the need for additional lead stand-off, a package of thickness 1.0 mm or less can easily be achieved. A thin package not only reduces material cost but provides additional thermal performance also. The relatively short leads of molded package 400, as compared to the inner leads-outer leads arrangements of conventional QFP packages, are expected to have lower parasitics than leads of a conventional QFP package. Thus, a package of the present invention provides electrical performance superior to a conventional QFP package. Also, as the manufacturing process described above requires little custom tooling, custom packages optimizing to device size and number of I/O terminals can be accommodated with minimal additional cost. By avoiding the cost of custom tooling and the cost of trimming and forming tools, and since molded package 400 requires less molding compound and lead frame material, molded package 400 is expect to cost only 10% to 20% of a comparable conventional QFP package.

Figure 5B:
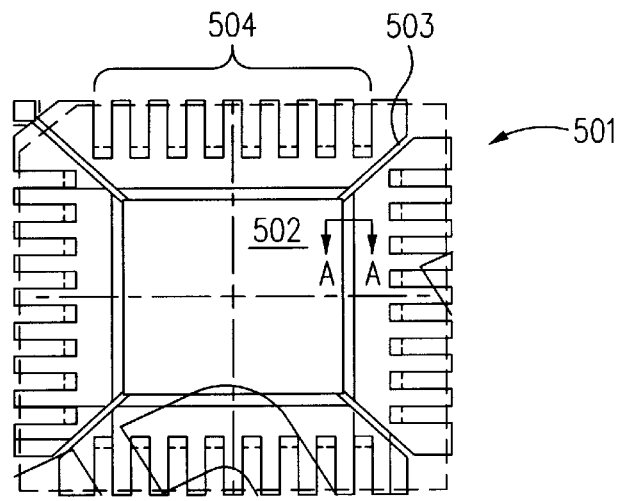
Figure 5C:
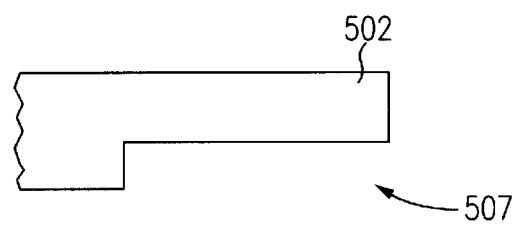
FIG. 5c shows a cross section, along line A—A, of die-attach pad 502 of FIG. 5b.
Figure 5D:
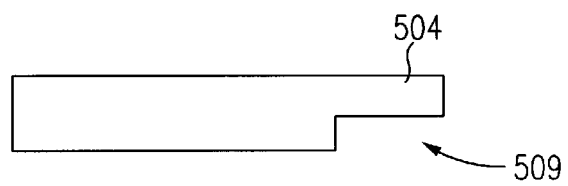
FIG. 5d shows a cross section of a lead in lead frame 501 of FIG. 5b.

FIG. 5a shows a 2×2 array 500 of lead frames, including lead frames 501-1 to 501-4, which can also be implemented in a section of strip 100, in accordance with another embodiment of the present invention. FIG. 5b shows in further detail lead frame 501, which is one of lead frames 501-1 to 501-4, showing die-attach pad 502, tie bars 503 and leads 504. In this embodiment, an interlocking lip 507 is provided in under side of die-attach pad 502. Interlocking lip 507 is shown in FIG. 5c in the cross section A—A of die-attach pad 502. Interlocking lip 507 allows the molding compound to flow underneath a portion of the die attach pad 502 to securely engage die-attach pad 502 to the encapsulation, thereby preventing moisture introduction into the package. FIG. 5d shows a cross section of a lead 504 in lead frame 501 of FIG. 5b. As shown in FIG. 5d, an interlocking lip 509, similar to interlocking lip 507 of die-attach pad 502, is provided in lead 504. As in interlocking lip 507, interlocking lip 509 allows the molding compound to hold lead 504 in place and to prevent introduction of moisture into the molded package.

FIG. 6a shows another embodiment of the present invention in a lead frame 600 for a "double row" SSLPCC. As shown in FIG. 6a, lead frame 600 includes a downset die-attach pad 601, which is suspended by tie-bars 607a–607d at the four corners of die-attach pad 601. At the other ends of tie bars 607a–607d are rectangular pads 604a–604c and triangular pad 605. Rectangular pads 604a–604c provide additional surfaces for heat dissipation. Triangular pad 605 is designed to be used for package orientation, such as indicating the position of pin 1.

Lead frame 600 includes an annular row of outer leads 602 and an annular row of inner leads 603, initially attached by a half-etched portion 606—i.e., the inner leads and the outer leads are connected by portion 606 which has a thickness one-half that of the leads. Half-etched portion 606 can be formed by etching the lead frame from the top using a conventional chemical etching process. In this embodiment, inner leads 603 and outer leads 602 each have a pitch of 0.5 mm, so that, with each lead being 0.25 mm wide, the spacing between adjacent leads is 0.25 mm. In this embodiment, each lead is 0.618 mm long. Annular inner leads 603 and annular outer leads 603 are positioned in a staggered or alternating manner to allow maximum room for wire-bonding from the bonding pads on the surface of a semiconductor die to be placed in die-attach pad 601 to each of the leads. Thus, very high pin density can be achieved.

FIGS. 6b and 6c shows respectively cross-sections of lead frame 600 along lines A—A and B—B. The cross-section shown in FIG. 6b cuts through outer leads 602, showing half-etched portion 606, and die-attach pad 601. Similarly, the cross section shown in FIG. 6c cuts through inner leads 603, showing half-etched portion 606.

Figure 7:
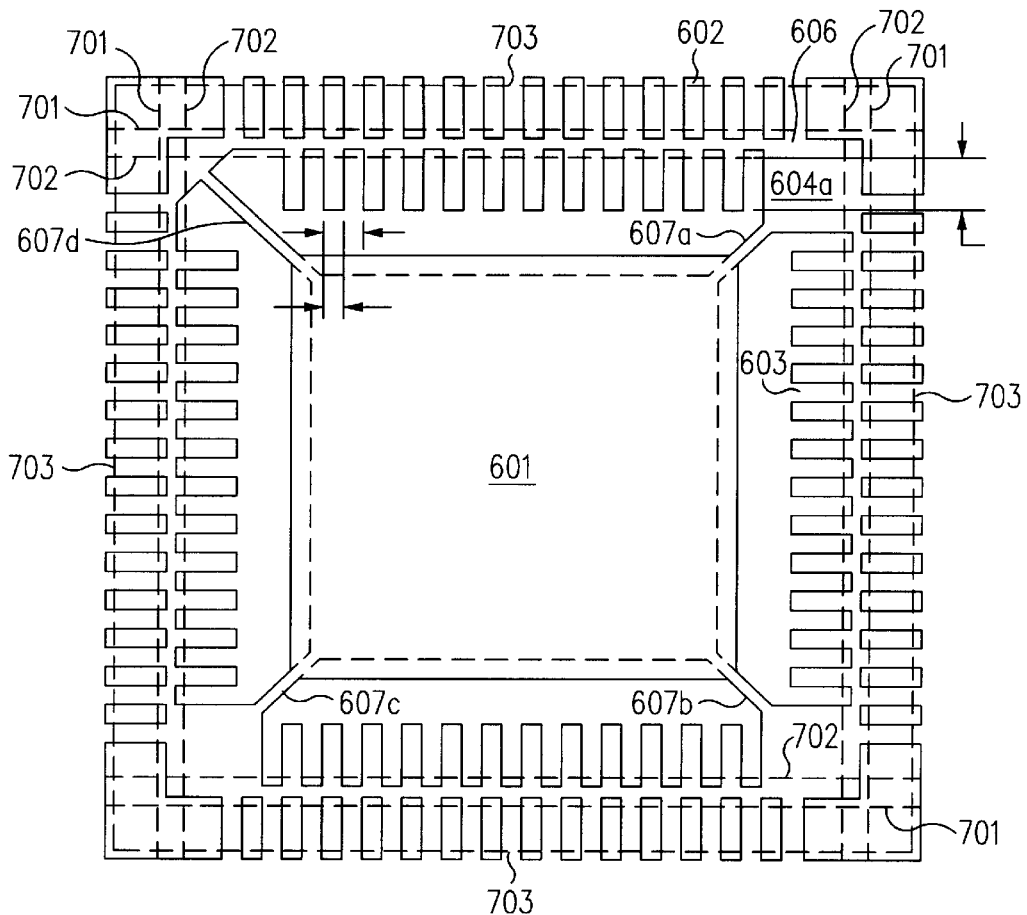
FIG. 7 shows lines 701, 702 and 703 along which lead frame 600 is cut to sever half-etched portion 606 (thereby severing inner leads 603 from outer leads 602) and for severing the leads in inner leads 603 and outer leads 602 from each other.

The assembly process for a double-row SSLPCC can follow the assembly process described above. However, in addition to the singulation step described above, an additional cut to sever half-etched portion 606 from the lead frame is provided. FIG. 7 shows lines 701, 702 and 703 along which lead frame 600 is cut to sever half-etched portion 606 (thereby severing inner leads 603 from outer leads 602) and for severing the leads in inner leads 603 and outer leads 602 from each other. Line 703 along the outer periphery is the singulation path for singulating the double-row SSLPCC from the adjacent packages. Line 701 and 702 severs half-etched portion 606. Of course, the cuts along lines 701 and 702 need only be deep enough to cut through half-etched portion 606. Half-etched portion provides clearance to prevent inadvertent damage to wire bonds between the bonding pads of the semiconductor die to outer leads 602.

Figure 8A:
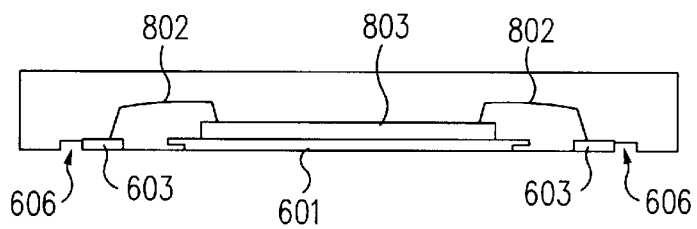
Figure 8B:
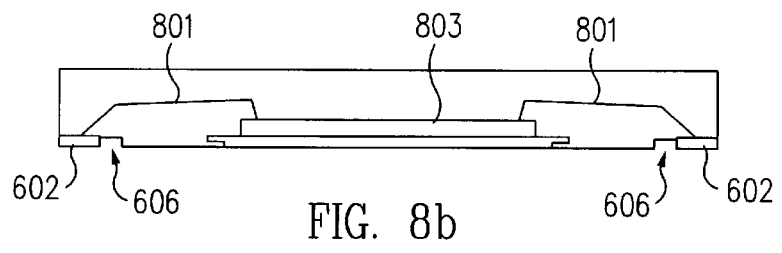

FIGS. 8a and 8b show cross sections of a double-row SSPLCC package (after singulation) along lines A—A (through outer leads 602) and B—B (through inner leads 603). In this embodiment, the loop heights of wire bonds 801 and 802 between the semiconductor die 803 to outer leads 602 (FIG. 8b) and to inner leads 603 (FIG. 8a) are 15 mils and 10 mils, respectively. (A trapezoidal loop profile can be selected for the wire bonds). For a thickness of 6 mils for each lead in outer leads 602 and inner leads 603, a 1 mil die-attach epoxy bondline and a 10 mil thick semiconductor die, a 1.2 mm thick package would provide a 15 mil clearance between the top of each bond wire loop to the top of the package. Half-cut to sever connecting portion 606 can be made to a depth of 5 mils.

The above detailed description is provided to illustrate the specific embodiments of the present invention and is not intended to be limiting. Numerous modifications and variations within the scope of the present invention are possible. The present invention is particularly pointed out and distinctly claimed in the following claims.

We claim:

1. A plastic chip carrier, comprising:
   a semiconductor die having bonding pads formed thereon;
   a die-attach pad having a bottom surface and a top surface on which said semiconductor die is attached;
   a plurality of leads, each having a bottom surface and a top surface, said leads disposed in close proximity to said die-attach pad;
   a plurality of wires each bonded to a selected one of said bonding pads and a corresponding one of said leads; and
   an encapsulation encapsulating said semiconductor die, said top surface of said die attach-pad, said wires, and said top surfaces of said leads, and exposing said bottom surface of said die-attach pad and said bottom surfaces of said leads, wherein said die-attach pad is provided an interlocking lip at a portion of said die-attach pad, said interlocking lip engaging said die-attach pad to said encapsulation.

2. A plastic chip carrier comprising:
   a semiconductor die having bonding pads formed thereon;
   a die-attach pad having a bottom surface and a top surface on which said semiconductor die is attached;
   a plurality of leads, each having a bottom surface and a top surface, said leads disposed in close proximity to said die-attach pad;
   a plurality of wires each bonded to a selected one of said bonding pads and a corresponding one of said leads;
   an encapsulation encapsulating said semiconductor die, said top surface of said die attach-pad, said wires, and said top surfaces of said leads, and exposing, flush with a bottom surface of said encapsulation, said bottom surface of said die-attach pad and said bottom surfaces of said leads; and
   a plurality of tie bars, each tie bar being attached to said die-attach pad and extending from said die-attach pad to form a peripheral heat pad for dissipating heat to the outside of said encapsulation.

3. A plastic chip carrier as in claim 3, wherein one of said heat pads has an appearance distinctive from other heat pads of said chip carrier.

4. A plastic chip carrier, comprising:
   a semiconductor die having bonding pads formed thereon;
   a die-attach pad having a bottom surface and a top surface on which said semiconductor die is attached;
   a plurality of leads, each having a bottom surface and a top surface, said leads disposed in close proximity to said die-attach pad;
   a plurality of wires each bonded to a selected one of said bonding pads and a corresponding one of said leads; and
   an encapsulation encapsulating said semiconductor die, said top surface of said die attach-pad, said wires, and said top surfaces of said leads, and exposing, flush with a bottom surface of said encapsulation, said bottom surface of said die-attach pad and said bottom surfaces of said leads, wherein said die-attach pad and said leads are formed out of an array of lead frames integrally formed on a portion of a metal strip.

5. A plastic carrier, comprising:
   a semiconductor die having bonding pads formed thereon;
   a die-attach pad having a bottom surface and a top surface on which said semiconductor die is attached;
   a plurality of leads, each having a bottom surface and a top surface, said leads disposed in close proximity to said die-attach pad;
   a plurality of wires each bonded to a selected one of said bonding pads and a corresponding one of said leads; and
   an encapsulation encapsulating said semiconductor die, said top surface of said die attach-pad, said wires, and said top surfaces of said leads, and exposing said bottom surface of said die-attach pad and said bottom surfaces of said leads, wherein said die-attach pad is plated with palladium.

6. A plastic carrier, comprising:
   a semiconductor die having bonding pads formed thereon;
   a die-attach pad having a bottom surface and a top surface on which said semiconductor die is attached;
   a plurality of leads, each having a bottom surface and a top surface, said leads disposed in close proximity to said die-attach pad;
   a plurality of wires each bonded to a selected one of said bonding pads and a corresponding one of said leads;
   an encapsulation encapsulating said semiconductor die, said top surface of said die attach-pad, said wires, and said top surfaces of said leads, and exposing said bottom surface of said die-attach pad and said bottom surfaces of said leads; and
   solder balls each attached to a bottom side of a corresponding one of said leads.

7. A metal strip of lead frames, comprising:
   a plurality of lead frames arranged as multiple groups of lead frames, each group of lead frames being formed on a substantially square area, each lead frame comprising:
   a die-attach pad;
   an annular row of inner leads;
   an annular row of outer leads connected to said annular row of inner leads by a connecting portion, wherein said die-attach pad is connected to said annular row of inner leads and said annular row of outer leads by a plurality of tie bars.

8. A metal strip as in claim 7, wherein in said lead frame leads in said annular row of inner leads and said annular row of outer leads are arranged in an alternating fashion.

9. A lead frame, comprising:

a die-attach pad;

an annular row of inner leads;

an annular row of outer leads connected to said annular row of inner leads by a connecting portion, wherein said die-attach pad is connected to said annular row of inner leads and said annular row of outer leads by a plurality of tie bars, wherein said connecting portion has a thickness which is half the thickness of a lead in said annular row of inner leads.

* * * * *